(12) United States Patent
Matsui

(10) Patent No.: US 9,820,392 B2
(45) Date of Patent: Nov. 14, 2017

(54) DISPLAY APPARATUS AND DISPLAY APPARATUS MANUFACTURING METHOD

(71) Applicant: JOLED INC., Tokyo (JP)

(72) Inventor: Hitoshi Matsui, Hokkaido (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/126,076

(22) PCT Filed: Dec. 24, 2014

(86) PCT No.: PCT/JP2014/006439
§ 371 (c)(1),
(2) Date: Sep. 14, 2016

(87) PCT Pub. No.: WO2015/140865
PCT Pub. Date: Sep. 24, 2015

(65) Prior Publication Data
US 2017/0118848 A1    Apr. 27, 2017

(30) Foreign Application Priority Data
Mar. 19, 2014  (JP) ................................. 2014-057189

(51) Int. Cl.
*G06F 1/16* (2006.01)
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC .......... G06F 1/1601; G06F 2200/1612; H05K 5/0004; H05K 5/0017; G02F 1/133308
See application file for complete search history.

(56) References Cited

U.S. PATENT DOCUMENTS 8,982,546 B2 *  3/2015  Lin ........................ G06F 1/1601
                                                                349/58
9,658,649 B2 *  5/2017  Kwon ................... G06F 1/1601
(Continued)

FOREIGN PATENT DOCUMENTS

JP         2007-94224      4/2007
JP         2008-9164       1/2008
(Continued)

OTHER PUBLICATIONS

International Search Report, along with English-language translation thereof, in PCT/JP2014/006439 dated Mar. 17, 2015.

*Primary Examiner* — Anthony Q Edwards
(74) *Attorney, Agent, or Firm* — Greenblum & Bernstein, P.L.C.

(57) ABSTRACT

A display apparatus includes: a display panel; a base disposed on the back side of the display panel; a frame component including a front surface portion disposed at a peripheral edge portion of the display panel on the display surface side, a fixing portion disposed on the back side of the base, and a connecting portion which connects the front surface portion and the fixing portion; an attachment component including a base portion connected to the base, and a holding portion disposed further backward than the fixing portion; and a fastening component which fastens the fixing portion and the holding portion.

6 Claims, 10 Drawing Sheets

(56) References Cited

U.S. PATENT DOCUMENTS

| | | | | |
|---|---|---|---|---|
| 2003/0090458 A1* | 5/2003 | Tajima | ................ | G06F 1/1601 |
| | | | | 345/156 |
| 2005/0078465 A1* | 4/2005 | Kim | .................. | H05K 5/0217 |
| | | | | 361/797 |
| 2008/0259542 A1* | 10/2008 | Juan | .................... | G06F 1/1601 |
| | | | | 361/679.24 |
| 2009/0261694 A1* | 10/2009 | Yamanaka | ............. | H04N 5/64 |
| | | | | 312/7.2 |
| 2013/0003283 A1* | 1/2013 | Sakamoto | ........ | G02F 1/133308 |
| | | | | 361/679.21 |
| 2014/0085796 A1* | 3/2014 | Mathew | .............. | G06F 1/1609 |
| | | | | 361/679.21 |
| 2015/0208523 A1* | 7/2015 | Lee | ........................ | H05K 5/02 |
| | | | | 361/679.01 |
| 2015/0237291 A1* | 8/2015 | Ohki | ................... | H04N 5/645 |
| | | | | 348/725 |

FOREIGN PATENT DOCUMENTS

| | | |
|---|---|---|
| JP | 2008-33093 | 2/2008 |
| JP | 2009-109886 | 5/2009 |
| JP | 2010-181432 | 8/2010 |
| JP | 2013-174707 | 9/2013 |
| WO | 2015/016209 | 2/2015 |

\* cited by examiner

DISPLAY APPARATUS AND DISPLAY APPARATUS MANUFACTURING METHOD

TECHNICAL FIELD

The present disclosure relates to a display apparatus which includes a frame component disposed at a peripheral edge portion of a display panel, and a method for manufacturing a display apparatus for attaching the frame component to the display panel.

BACKGROUND ART

Patent Literature 1 (PTL 1) discloses a display apparatus which includes a frame component covering a peripheral edge portion of a display panel. With this display apparatus, the frame component functions as an escutcheon frame (protective frame) covering the entire peripheral edge of the display surface of the display panel on which images are displayed.

CITATION LIST

Patent Literature

[PTL 1] Japanese Unexamined Patent Application Publication No. 2008-9164

SUMMARY OF INVENTION

Technical Problem

The present disclosure provides a display apparatus which includes a frame component disposed at a peripheral edge portion of a display panel and pressed against or disposed in close vicinity to the display surface of the display panel, and a method for manufacturing such a display apparatus.

Solution to Problem

In order to achieve the object described above, the display apparatus according to the present disclosure includes: a display panel which displays an image; a base which is plate-shaped and disposed on a back side of the display panel opposite a display surface side on which the image is displayed; a frame component including a front surface portion disposed at a peripheral edge portion of the display panel on the display surface side, a fixing portion disposed on a back side of the base, and a connecting portion which is disposed exterior to a peripheral edge of the display panel and connects the front surface portion and the fixing portion; an attachment component including a base portion connected to the base, and a holding portion disposed further backward than the fixing portion of the frame component; and a fastening component which fastens the fixing portion and the holding portion of the attachment component.

Advantageous Effects of Invention

According to the present disclosure, it is possible to reduce, to the extent possible, a gap between the frame component and the display surface of the display panel, thereby enabling effective reduction of dust and so forth entering the gap.

DESCRIPTION OF EMBODIMENT

The inventor has discovered the following problems related to a conventional display apparatus.

Figure 1:
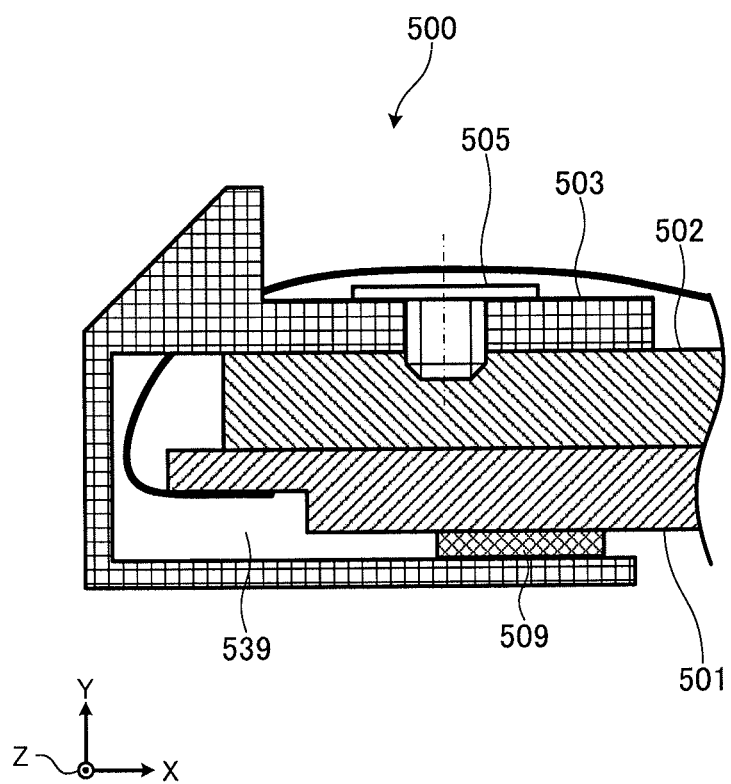
FIG. 1 is a cross section view illustrating a relationship between a display panel and a frame component of a conventional display apparatus.

FIG. 1 is a cross section view illustrating a relationship between a display panel and a frame component of a conventional display apparatus.

As Illustrated in FIG. 1, a conventional display apparatus 500, for example, a display apparatus 500 having a liquid crystal display panel includes a display panel 501 which displays video and the like and a frame component 503 disposed to cover the respective edges of the display panel 501 and a base 502 that overlap with each other. The frame component 503 is a component with a C-shaped cross section, and has a groove 539 extending in the extending direction of the frame component 503 (Z axis direction in FIG. 1). The width of the groove 539 (length in Y axis direction in FIG. 1) is greater than the thickness of the overlapping display panel 501 and base 502 (length in Y axis direction in FIG. 1). A relatively thick gasket 509 filling a gap between the frame component 503 and the display panel 501 is attached to the inner surface of the groove 539 of the frame component 503.

To assemble the display apparatus 500 having such a structure, the frame component 503 is disposed over the overlapping display panel 501 and base 502 in such a manner that the respective edges of the display panel 501 and the base 502 fit into the groove 539 of the frame component 503, and then the frame component 503 and the base 502 are fastened using a fastening component 505 from the back side.

With the display apparatus 500 having such a structure, a gap is generated between the display panel 501 and the frame component 503, and the frame component 503 protrudes to the front of the display panel 501, resulting in a problem of degradation in the visibility and design of the display apparatus 500. In addition, there are also problems that the gasket 509 deforms due to rubbing of the gasket 509 and the display panel 501 against each other when the frame component 503 is disposed, and that the gasket 509 adversely affects a resin sheet disposed on the front surface of the display panel 501.

The present disclosure has been conceived in view of the above problems and so forth. The following describes an embodiment with reference to the drawings where appropriate. It should be noted, however, that detailed descriptions may be omitted where unnecessary. For example, detailed descriptions of well-known aspects or repetitive descriptions of essentially similar structures may be omitted. This is to avoid redundancy and make the following description easier for those skilled in the art to understand.

It should be noted that the inventor provides the accompanying drawings and the following description not to limit the subject matter of the claims, but to aid those skilled in the art to adequately understand the present disclosure.

Embodiment 1

Outline of Structure of Display Apparatus

Figure 2:
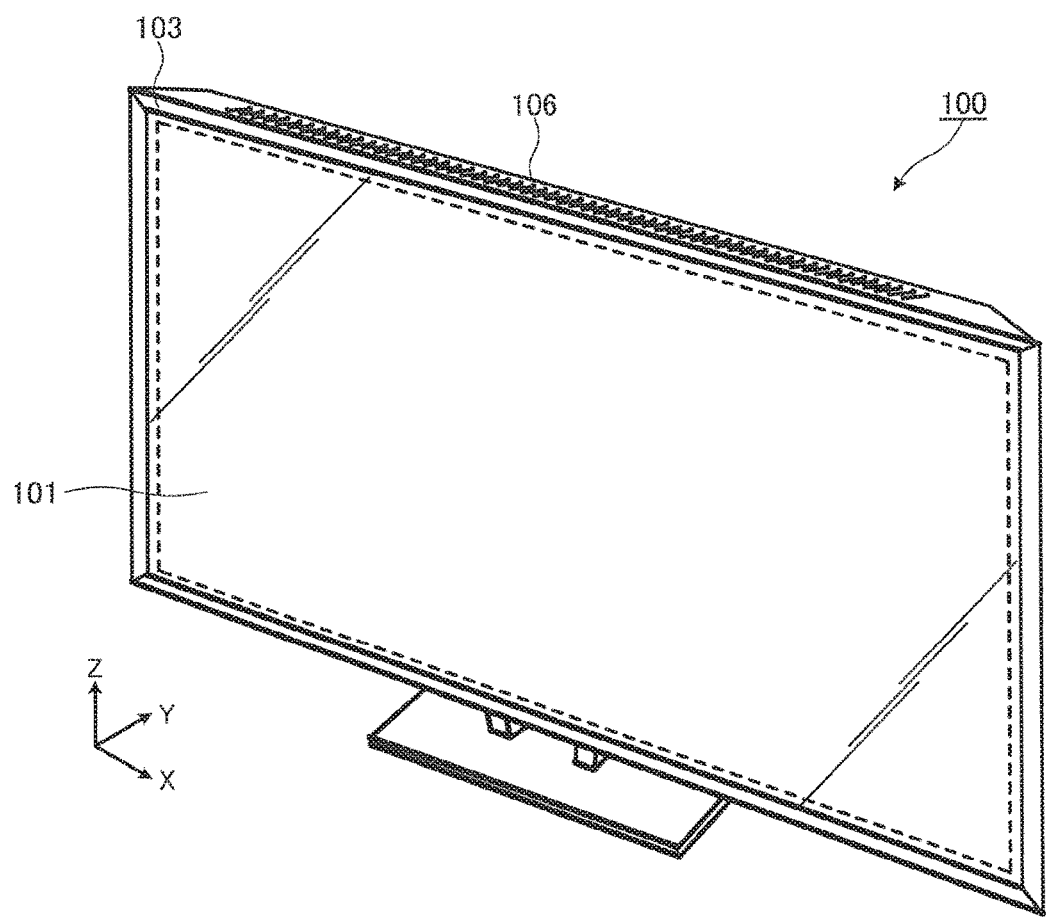
FIG. 2 is a perspective view illustrating an external appearance of a display apparatus according to Embodiment 1.

FIG. 2 is a perspective view illustrating an external appearance of a display apparatus according to Embodiment 1.

Figure 3:
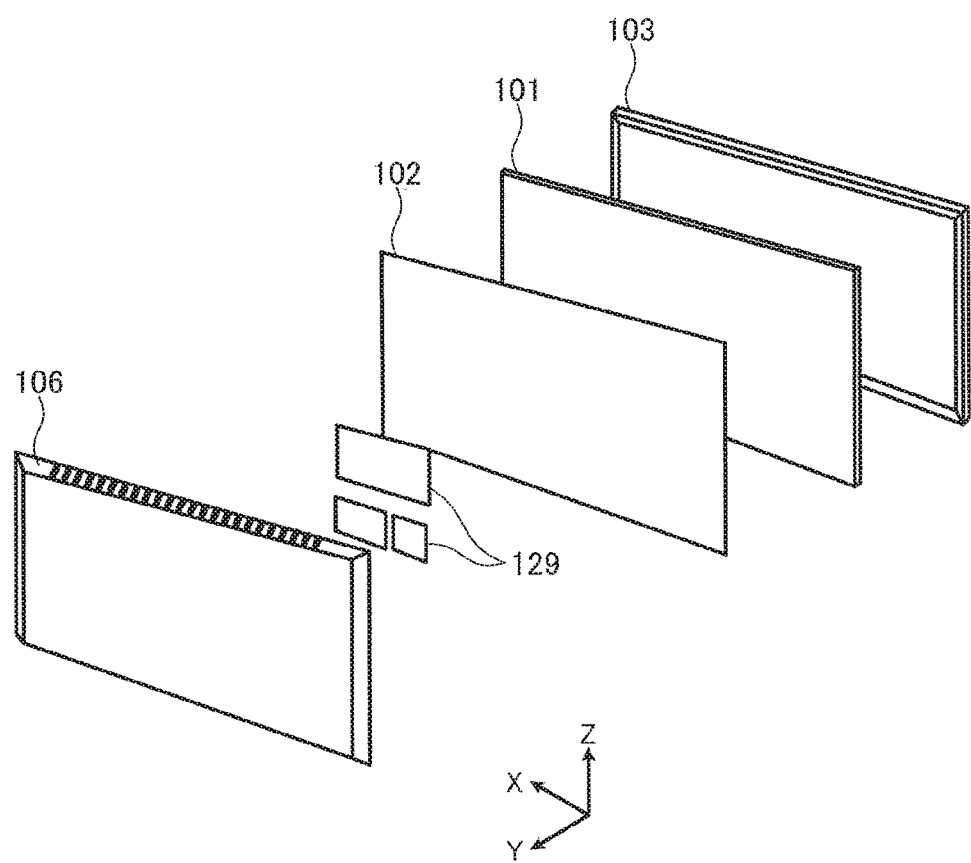
FIG. 3 is an exploded perspective view illustrating an outline of the structure of a display apparatus according to Embodiment 1.

FIG. 3 is an exploded perspective view illustrating an outline of the structure of the display apparatus according to Embodiment 1.

It should be noted that these figures are schematic illustrations of the structure of a display apparatus 100, and the details are omitted.

The display apparatus 100 includes a display panel 101, a base 102, a frame component 103, attachment components 104 (not illustrated in FIG. 2 and FIG. 3), and fastening components 105 (not illustrated in FIG. 2 and FIG. 3).

In the present embodiment, the display apparatus 100 is, for example, a television which outputs video and audio obtained from broadcast waves or the like received. The display apparatus 100 further includes circuit boards 129 and a back cover 106 which covers the back side of the display panel 101.

The display panel 101 is a device which displays an image, for example. In the present embodiment, the display panel 101 is an organic electroluminescent (EL) display panel which includes, as a light emitting element, an organic EL diode which is a light emitting diode having a luminescent layer made from an organic compound. The thickness of the display panel 101 is in a range from 1 mm to 3 mm approximately, for example.

It should be noted that the type of the display panel 101 is not particularly limited, and may be, for example, a plasma display panel which is a self-luminous display panel like the organic EL display panel or a liquid crystal display panel which includes a back light unit. The thickness is also not particularly limited.

The base 102 is component which is plate-shaped and disposed on the back side of the display panel 101 (the surface on the positive side of Y axis in figures), and holds the display panel 101. The base 102 holds the circuit boards 129 on the back surface of the base 102. The base 102 is, for example, made from a metal plate which is typically called a chassis, and may be provided with depressions and projections by a stamping process or the like to increase the structural strength, for example. In addition, a boss or the like may be attached to the base 102 for screwing. Furthermore, the base 102 is disposed to cover the entire (or almost the entire) back surface of the display panel 101, and may have a function to dissipate heat generated by the display panel 101.

Each of the circuit boards 129 is formed by, for example, disposing an electric circuit including a plurality of electric components 80 on a board the base material of which is a resin plate. Specifically, for example, each circuit board 129 includes a circuit such as a signal processing circuit which processes a video signal received, a control circuit which controls operations of a scan driver circuit and a signal line driver circuit, or a power source circuit which receives electric power from outside and supplies the electric power to each circuit.

It should be noted that FIG. 3 is an exemplary and schematic illustration of the circuit boards 129, and not all the circuit boards 129 necessary for the display apparatus 100 are illustrated. Furthermore, the base 102 also holds a plurality of circuit boards having the above function but not illustrated in FIG. 3. Specifically, such circuit boards are, for example, a scan driver circuit which supplies a scan drive signal to the display panel 101 and a signal line driver circuit which supplies a signal voltage to the display panel 101. It should be noted that the scan driver circuit is also known as a gate driver or a scan driver, for example, and the signal line driver circuit is also known as a data driver or a source driver, for example.

Figure 4:
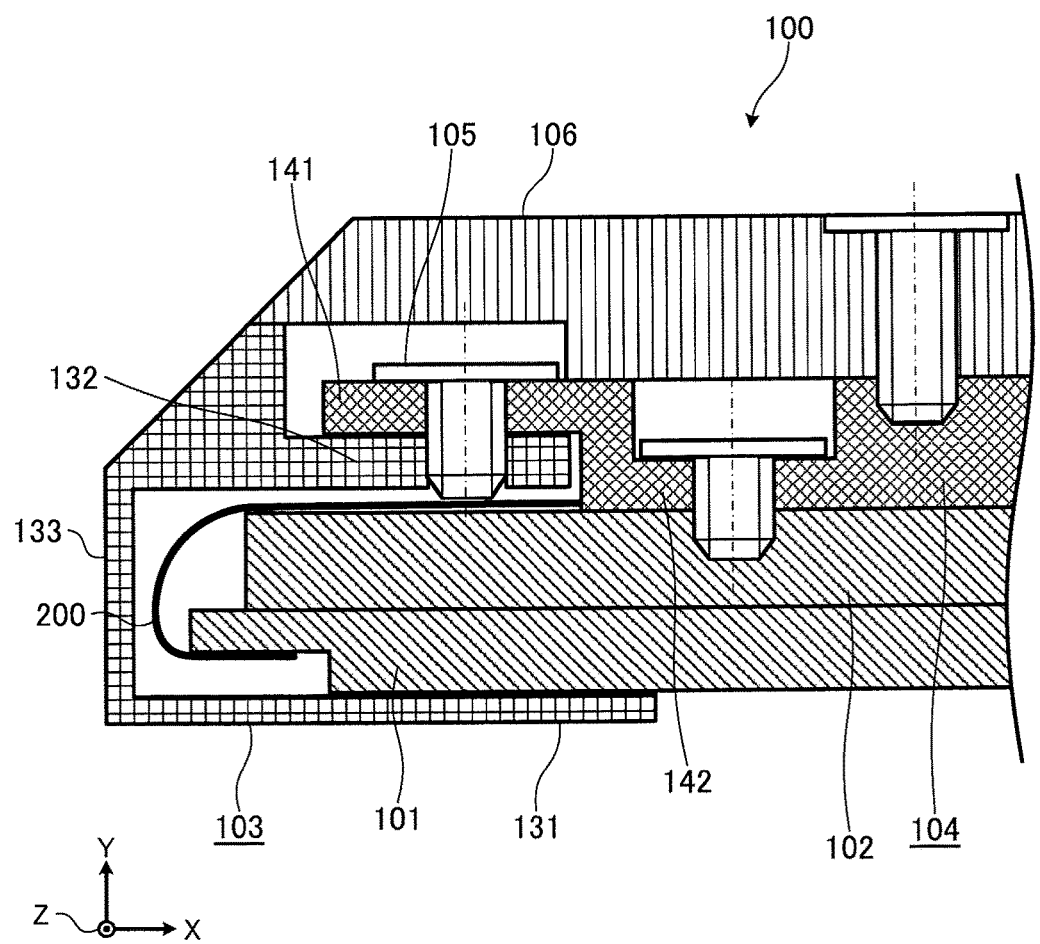
FIG. 4 is a cross section view illustrating a relationship between a display panel and a frame component according to Embodiment 1.

These circuit boards not illustrated are disposed along the peripheral edge of the base 102, and each circuit board and the display panel 101 are connected by a chip on film (COF) 200, for example (see FIG. 4).

FIG. 4 is a cross section view illustrating a relationship between the display panel and the frame component of the display apparatus according to the present embodiment.

Figure 5:
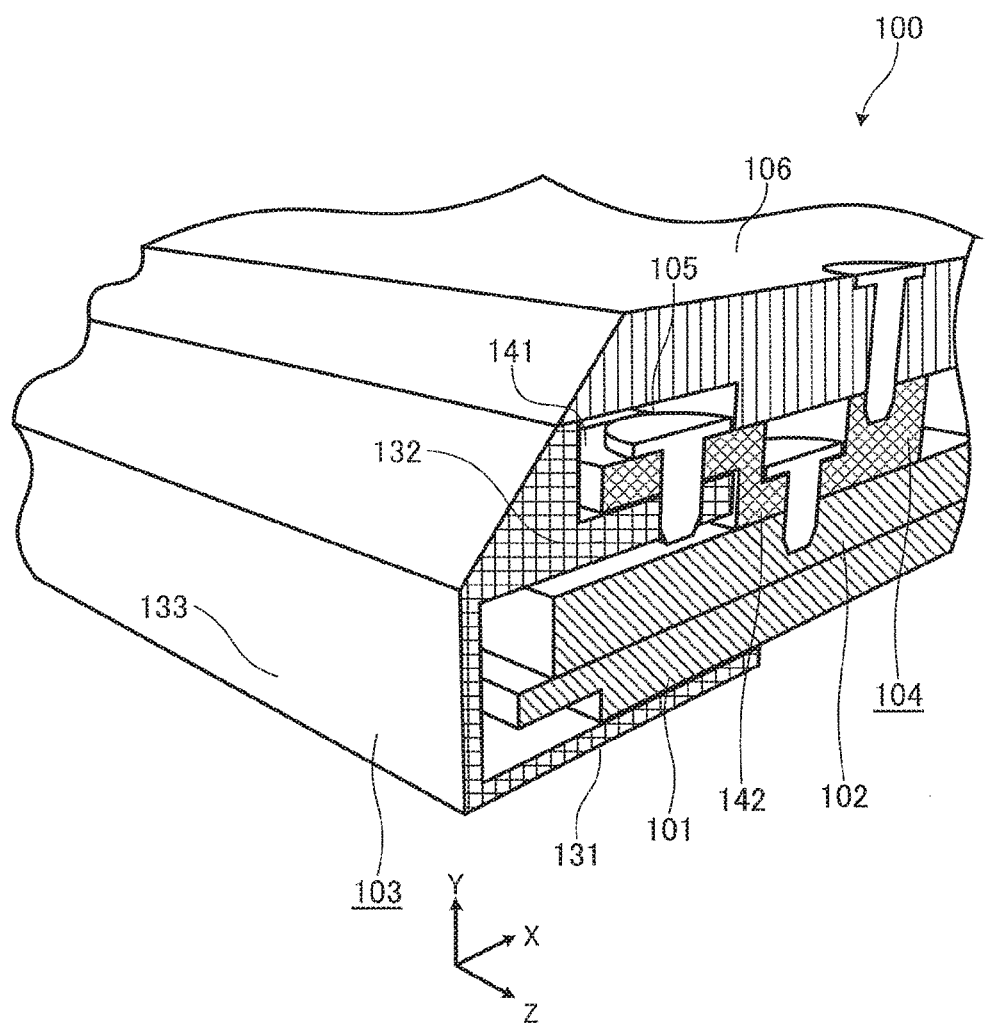
FIG. 5 is a perspective cross section view illustrating a relationship between a display panel and a frame component of a display apparatus.

FIG. 5 is a perspective cross section view illustrating a relationship between the display panel and the frame component of the display apparatus.

Figure 6:
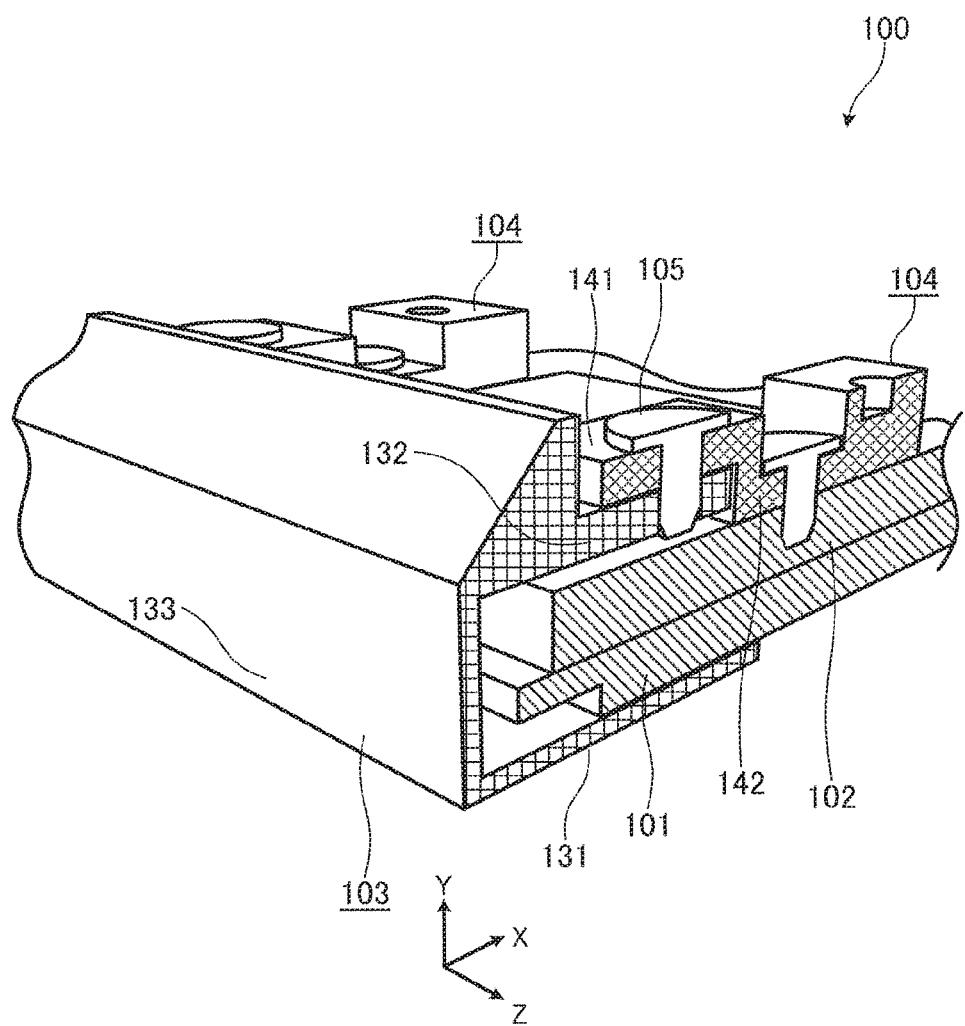
FIG. 6 is a perspective cross section view illustrating a relationship between a display panel and a frame component of a display apparatus with a back cover removed.

FIG. 6 is a perspective cross section view illustrating a relationship between the display panel and the frame component of the display apparatus with the back cover removed.

As illustrated in FIGS. 4, 5, and 6, the frame component 103 is a component which covers the respective peripheral edge portions of the display panel 101 and the base 102 that are disposed as overlapping layers. In the present embodiment, the frame component 103 is configured by assembling the following four components into a picture frame shape: two components covering the longer sides of the display panel 101 and the base 102 and two components covering the shorter sides of the display panel 101 and the base 102. Each of the four components of the frame component 103 is a rod-shaped component which has a C-shaped cross section, includes a front surface portion 131, fixing portions 132, and a connecting portion 133, and is formed by extrusion molding, for example.

The front surface portion 131 is a portion of the frame component 103 which is disposed in close vicinity to or in contact with the peripheral edge portion of the display panel 101 on the display surface side. The front surface portion 131 may be in direct or indirect contact with the front surface of the display panel 101. In the present embodiment, the front surface portion 131 is pressed against the display panel 101 by a certain pressure.

This configuration makes it possible to reduce, to the extent possible, the gap generated between the display panel 101 and the front surface portion 131 of the frame component 103, thereby enabling improvement in the visibility of the display panel 101 and in the design of the display apparatus 100.

Figure 7:
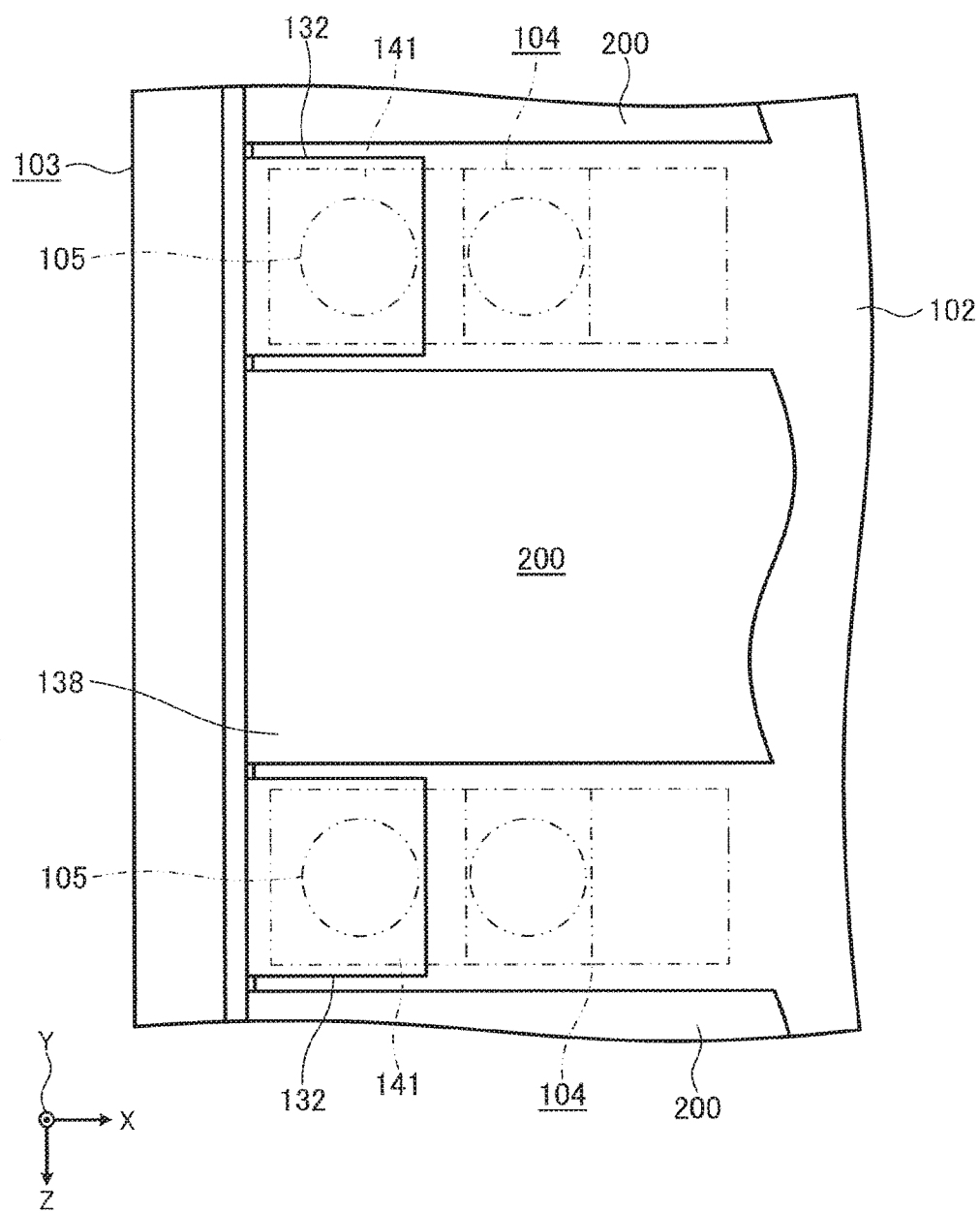
FIG. 7 is a plan view illustrating, from the back side of a display apparatus, a relationship between attachment components and a frame component of the display apparatus with a back cover removed.

Each of the fixing portions 132 is a portion of the frame component 103 which is disposed on the back side of the base 102. Each fixing portion 132 is held by being fastened with a holding portion 141 (described later) of an attachment component 104 disposed further backward. In the present embodiment, as illustrated in FIG. 7, the fixing portions 132 protrude toward the inside of the display apparatus 100, and are disposed at predetermined intervals along the extending direction of the frame component 103 (that is, Z axis direction in FIG. 7, but may also be X axis direction). When the frame component 103 is formed by extrusion molding, each fixing portion 132 is formed by cutting out regions between the fixing portion 132 and adjacent fixing portions 132. Wires, such as the COF 200, which connect the circuit boards 129 with electrodes disposed one level down from the front surface of the display panel 101 are disposed between adjacent fixing portions 132.

In addition, in the present embodiment, a force pressing the front surface portion 131 of the frame component 103 against the display panel 101 is generated based on the fastening force generated by fastening the fixing portions 132 and attachment components 104.

It should be noted that when the gap between the fixing portions 132 and the base 102 is wide enough for the COF 200 and the other wires etc., to pass through, the COF 200 and the other wires can be disposed without providing a cutout 138 between adjacent fixing portions 132 as illustrated in FIG. 7. This makes it possible to maintain the structural strength of the frame component 103. Furthermore, when the frame component 103 is formed by extrusion molding, it is possible to omit the process of providing a cutout after the molding, thereby enabling an increase in the production efficiency of the display apparatus 100.

Moreover, the fastening of the fixing portions 132 and the attachment components 104 does not necessarily have to generate the pressing force mentioned above. For example, the front surface portion 131 can be disposed in close vicinity to or in contact with the front surface of the display panel 101.

The connecting portion 133 is a portion of the frame component 103 which is disposed exterior to the peripheral edge of the display panel 101 and connects the front surface portion 131 and the fixing portions 132. The connecting portion 133 has a strength that allows the distance between the front surface portion 131 and the fixing portions 132 to be maintained constant. In the present embodiment, the connecting portion 133 conveys, to the front surface portion 131, the force generated by the fastening of the fixing portions 132 and the attachment components 104, so that the front surface portion 131 is pressed against the front surface of the display panel 101.

Each of the attachment components 104 is a component including a base portion 142 which is connected to the base 102, and a holding portion 141 disposed further backward than a fixing portion 132 of the frame component 103. In the present embodiment, each attachment component 104 is a component separate from the base 102, and is attached to the base 102 through the fastening of the base portion 142 to the base 102. Furthermore, the holding portion 141 is disposed with such spacing from the base 102 that, in a state in which the base portion 142 of the attachment component 104 is attached to the base 102, the fixing portion 132 of the frame component 103 can be inserted between the holding portion 141 and the base 102. Specifically, the spacing between the holding portion 141 and the base 102 is at least greater than the thickness of the fixing portion 132.

A plurality of attachment components 104 are disposed on the base 102 to correspond to the fixing portions 132 of the frame component 103. Wires such as the COF 200 and the circuit boards 129 may be disposed between adjacent fastening components 105.

It should be noted that in the present embodiment, the attachment components 104 are described as components separate from the base 102, but are not limited to this. For example, the present disclosure also includes the case where the base 102 is plastic-deformed by press molding or the like, causing part of the base 102 to function as the attachment components 104.

Furthermore, each attachment component 104 connects, through engagement or fastening, with the back cover 106 which covers the back side of the base 102, and has a function to hold the back cover 106 on the back side of the base 102.

Each of the fastening components 105 is a component which fastens a fixing portion 132 and the holding portion 141 of an attachment component 104. In the present embodiment, each fastening component 105 is a screw which generates a fastening force by threaded engagement. Each fastening component 105 is inserted into a hole provided in the holding portion 141 of an attachment component 104 and is threadedly engaged with a female screw provided in a fixing portion 132, so as to fasten the fixing portion 132 and the holding portion 141.

It should be noted that each fastening component 105 is not limited to a screw which generates a fastening force by threaded engagement, and may be any component so long as it generates a fastening force, such as a rivet which generates a fastening force by plastic deformation or a snap which generates a fastening force by elastic force. Furthermore, even when at least one of the fixing portion 132 and the holding portion 141 generates a fastening force by engaging with the other through plastic deformation, for example, the portion generating the fastening force functions as a fastening component 105.

Moreover, as a part of a fastening component 105, a boss or the like having a nut or a female screw may be fixed to the base 102 or the fixing portion 132, for example, to generate a strong fastening force.

Next, a method for manufacturing the display apparatus 100 will be described.

The display panel 101 and the base 102 which is plate-shaped and disposed on the back side of the display panel 101 are stuck together using a double-sided adhesive tape, for example.

Next, the attachment components 104 are attached to the base 102 by fastening, for example.

Then, the fixing portions 132 of the frame component 103 are inserted between the base 102 and the holding portions 141 of the attachment components 104 while inserting, between the front surface portion 131 and the fixing portions 132 of the frame component 103, the respective peripheral edges of the display panel 101 and the base 102 that are stuck together.

Subsequently, the fixing portions 132 of the frame component 103 and the holding portions 141 of the attachment components 104 are fastened by fastening components.

The above fastening makes it possible to press the front surface portion 131 of the frame component 103 against the peripheral edge portion of the display panel 101. It should be noted that instead of pressing the front surface portion 131 against the display panel 101, the front surface portion 131 may be disposed in close vicinity to or in contact with the display panel 101.

Other than the above steps, the back cover 106 is fixed to the attachment components 104 by fastening, for example, so as to manufacture the display apparatus 100.

With the display apparatus 100 and the method for manufacturing the display apparatus 100 described above, by making the spacing between the front surface portion 131 and the fixing portions 132 of the frame component 103 relatively large, it is possible to easily insert the respective peripheral edge portions of the display panel 101 and the base 102 between the front surface portion 131 and the fixing portions 132 of the frame component 103, and reduce, to the extent possible, the gap between the front surface of the display panel 101 and the front surface portion 131 of the frame component 103.

Accordingly, it is possible to increase the visibility of images and the like displayed by the display apparatus 100 and enhance the aesthetic appearance of the display apparatus 100. In addition, it is possible to reduce dust and so forth entering the region between the display panel 101 and the front surface portion 131.

Particularly when the display apparatus 100 employs an organic EL display panel, it is possible to increase the strength of the force pressing the front surface portion 131 of the frame component 103 against the display panel 101, allowing an increase in the adhesion between the display panel 101 and the front surface portion 131.

Furthermore, with the fastening of the frame component 103 and the attachment components 104, it is possible to generate a force in the direction in which the display panel 101 and the base 102 are pressed, thereby allowing an increase in the adhesion between the display panel 101 and the base 102. Consequently, the heat generated by the display panel 101 can be transferred to the base 102 more easily, allowing an increase in the heat dissipation efficiency of the display apparatus 100.

Next, variations of the display apparatus 100 will be described.

[Variation 1]

Figure 8:
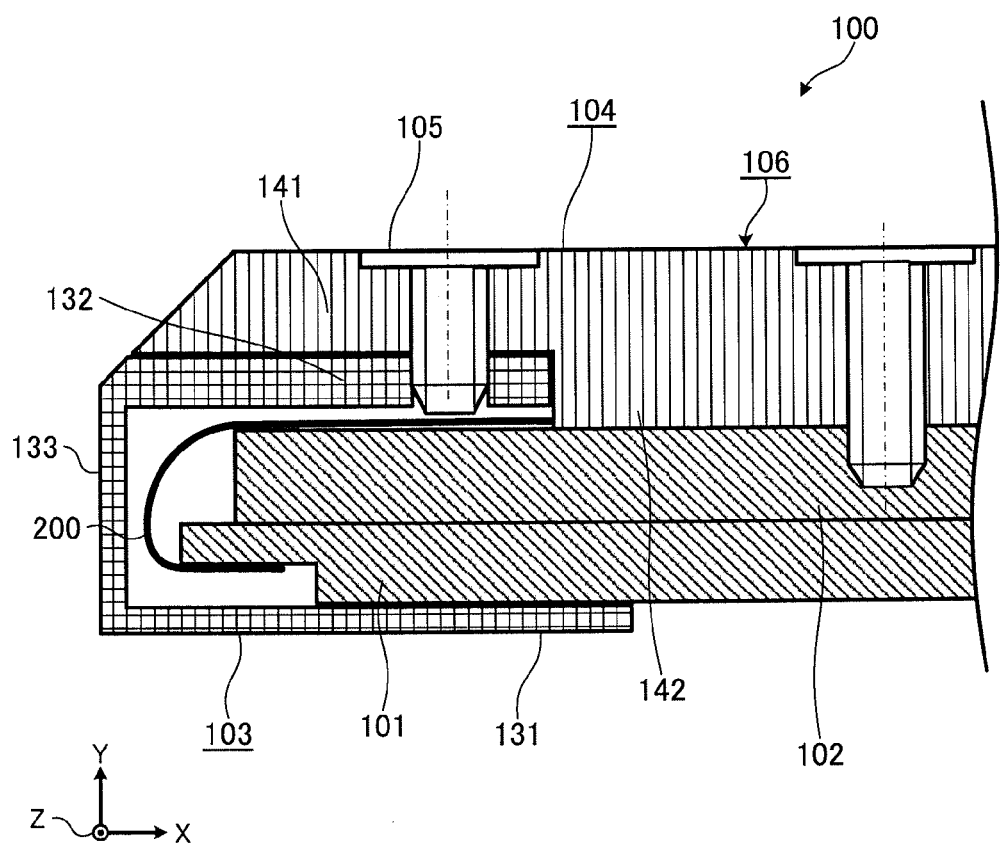
FIG. 8 is a cross section view illustrating a relationship between a display panel and a frame component according to Variation 1 of Embodiment 1.

FIG. 8 is a cross section view illustrating a relationship between the display panel and the frame component according to Variation 1 of Embodiment 1.

As Illustrated in FIG. 8, the holding portions 141 of the attachment components 104 included in the display apparatus 100 are part of the back cover 106 which covers the back side of the base 102. Furthermore, in Variation 1, the entire attachment components 104, including the respective base portions 142, are part of the back cover 106.

According to Variation 1, there is no need to prepare the attachment components 104 as independent components, and the number of components of the display apparatus 100 can be reduced, thereby allowing an increase in the production efficiency of the display apparatus 100.

[Variation 2]

Figure 9:
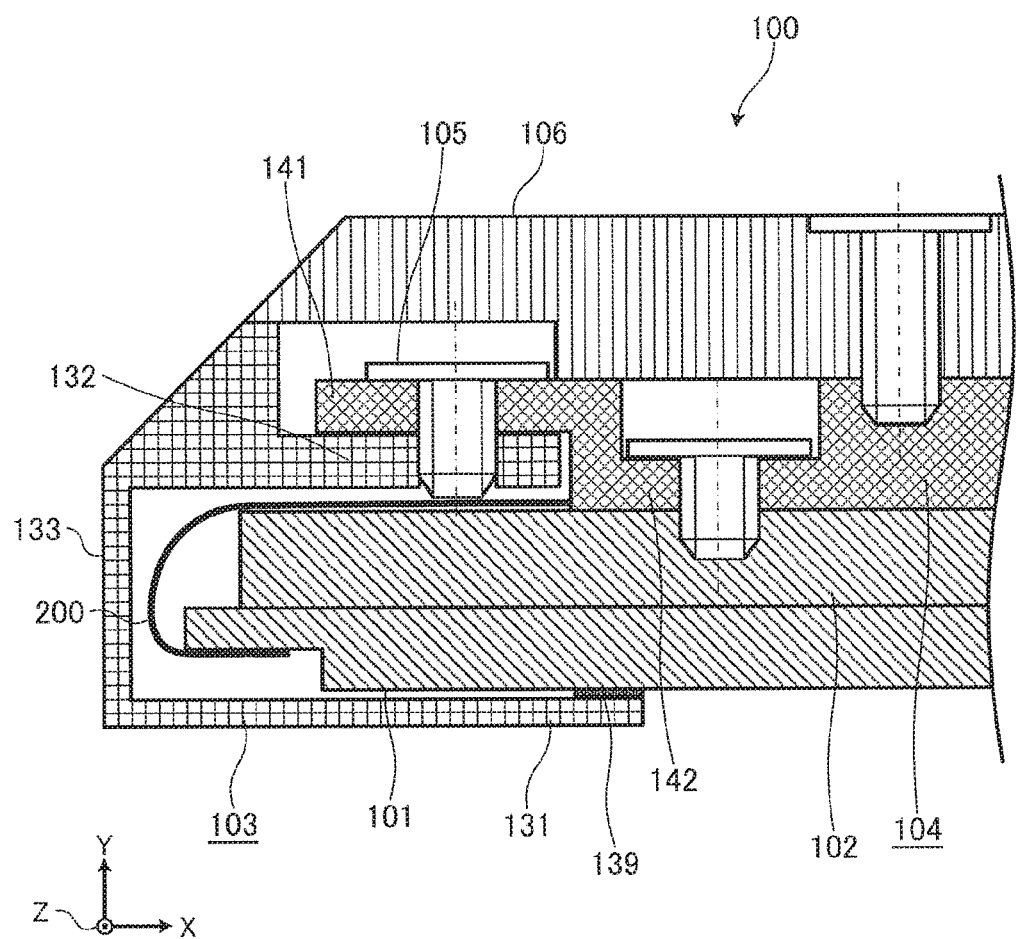
FIG. 9 is a cross section view illustrating a relationship between a display panel and a frame component according to Variation 2 of Embodiment 1.

FIG. 9 is a cross section view illustrating a relationship between the display panel and the frame component according to Variation 2 of Embodiment 1.

As Illustrated in FIG. 9, a cushioning component 139 may be disposed between the front surface portion 131 of the frame component 103 and the display panel 101.

This makes it possible to increase the sealability between the front surface portion 131 of the frame component 103 and the display panel 101. Furthermore, even if the display panel 101 and the frame component 103 make a relative movement in a direction along the display surface during manufacturing of the display panel 101 or transportation of the display apparatus 100, it is possible to effectively reduce damage or the like to the film and other components disposed on the surface of the display panel 101.

[Variation 3]

Figure 10:
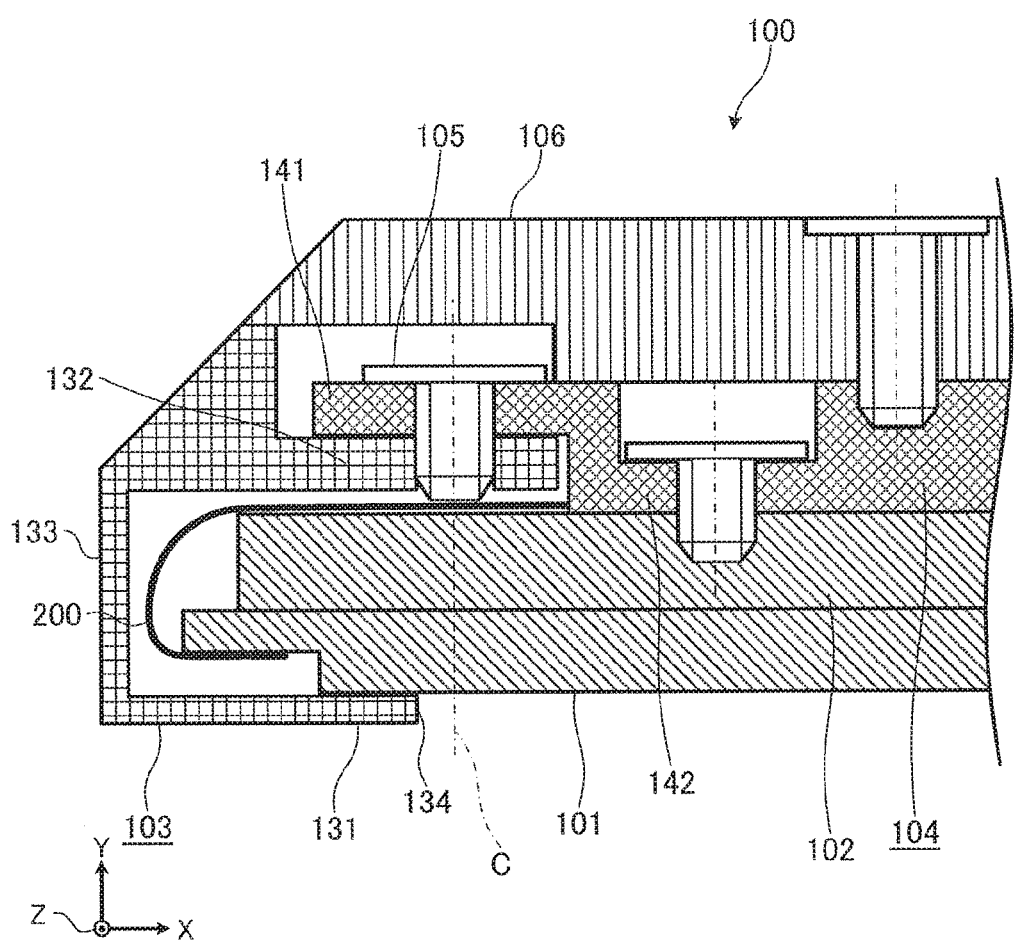
FIG. 10 is a cross section view illustrating a relationship between a display panel and a frame component according to Variation 3 of Embodiment 1.

FIG. 10 is a cross section view illustrating a relationship between the display panel and the frame component according to Variation 3 of Embodiment 1.

As illustrated in FIG. 10, in a plane parallel to the display surface of the display panel 101 (XZ plane in FIG. 10), the fixing portion 132 and the holding portion 141 of the attachment component 104 may be fastened by the fastening component 105 at a position further inward (closer to the center of the display panel 101) than an Inner edge 134 of the front surface portion 131 of the frame component 103. Specifically, the inner edge 134 of the front surface portion 131 of the frame component 103 fastened by the fastening component 105 is disposed further outward than the central axis C of the fastening component 105 in the plane parallel to the display surface of the display panel 101 (XZ plane in FIG. 10). Here, being disposed "further outward than the fastening component 105" means not only being disposed further outward than the central axis C of the fastening component 105. It is only necessary that the inner edge 134 be disposed further outward than an edge portion of the fastening component 105 on the inward side.

According to Variation 3, the area of contact between the display panel 101 and the front surface portion 131 can be reduced while generating, with the fastening force generated by the fastening of the fixing portions 132 and the attachment components 104, a force causing the front surface portion 131 of the frame component 103 to press the display panel 101, thereby making it possible to achieve both the effect of reducing, to the extent possible, the gap between the display panel 101 and the front surface portion 131 and the effect of improving the design of the display apparatus 100.

Other Embodiments

As described above, Embodiment 1 and variations thereof are presented as examples of the technique disclosed in the present application. However, the technique according to the present disclosure is not limited to Embodiment 1 and variations thereof, and can also be applied to embodiments obtained through modification, replacement, addition, or omission to Embodiment 1 and variations thereof as necessary. Furthermore, it is possible to make a new embodiment by combining the structural elements described in Embodiment 1 and variations thereof.

For example, in Embodiment 1, the display apparatus 100 is assumed to be a television which includes an organic EL display panel. The display apparatus 100, however, may be an apparatus other than a television. For example, the display apparatus 100 may be implemented as a monitor apparatus which displays video input from outside, digital signage used as advertising media, and a mobile terminal, a tablet terminal, and a table-type display apparatus which receive a user operation through a touch panel.

As described above, embodiments are described as examples of the technique according to the present disclosure. The accompanying drawings and detailed description are provided for this purpose.

Therefore, the structural elements described in the accompanying drawings and detailed description may include not only structural elements essential to solving the problems but also structural elements that are not essential to solving the problems, in order to provide examples of the above-described technique. As such, these non-essential structural elements should not be deemed essential due to the mere fact that they are included in the accompanying drawings and the detailed description.

Moreover, since the embodiments above show examples of the technique according to the present disclosure, various modifications, replacements, additions, omissions, or the like can be made within the scope of the claims or in a scope equivalent thereto.

The frame component 103 may be configured not only by assembling the rod-shaped components but also by assembling components among which at least the front surface portion 131 is a rectangular-looped one-piece component. In this case, the front surface portion 131 and the fixing portions 132 are made from separate components, disposed at the respective peripheral edges of the display panel 101 and the base 102, and connected by the connecting portion 133, so that the frame component 103 can be attached. This allows the front surface portion 131 to be formed into a frame shape seamlessly on the display surface side of the display apparatus 100, thereby enabling improvement in the design of the display apparatus 100.

INDUSTRIAL APPLICABILITY

The present disclosure is applicable to a display apparatus which displays images, characters, and video, and for which a smaller frame is demanded. Specifically, the present disclosure is applicable to electronic devices such as a television, a monitor display, digital signage, a mobile terminal, a tablet terminal, and a table-type display apparatus.

The invention claimed is:

1. A display apparatus comprising:
   a display panel which displays an image;
   a base which is plate-shaped and disposed on a back side of the display panel opposite a display surface side on which the image is displayed;
   a frame component including a front surface portion disposed at a peripheral edge portion of the display panel on the display surface side, a fixing portion disposed on a back side of the base, and a connecting portion which is disposed exterior to a peripheral edge of the display panel and connects the front surface portion and the fixing portion;
   an attachment component including a base portion connected to the base, and a holding portion disposed further backward than the fixing portion of the frame component; and
   a fastening component which fastens the fixing portion and the holding portion of the attachment component.

2. The display apparatus according to claim 1, wherein the attachment component is a separate component attached to the base by fastening.

3. The display apparatus according to claim 1, wherein the holding portion of the attachment component is part of a back cover which covers the back side of the base.

4. The display apparatus according to claim 1, wherein, in a plane parallel to a display surface of the display panel, an inner edge of the front surface portion of the frame component is disposed further outward than the fastening component which fastens the fixing portion and the attachment component.

5. The display apparatus according to claim 1, wherein a chip on film is inserted between the fixing portion of the frame component and the base, the chip on film connecting the display panel and a circuit board disposed on the back side of the base.

6. A method for manufacturing a display apparatus, the display apparatus including:
   a display panel which displays an image;
   a base which is plate-shaped and disposed on a back side of the display panel opposite a display surface side on which the image is displayed; and
   a frame component disposed at a peripheral edge portion of the display panel and a peripheral edge portion of the base,
   the method comprising:
   disposing a front surface portion of the frame component at the peripheral edge portion of the display panel by fastening, using a fastening component, a fixing portion of the frame component and a holding portion of an attachment component connected to the base, the front surface portion being disposed at the peripheral edge portion of the display panel on the display surface side, the fixing portion being disposed on a back side of the base, the attachment component including a base portion connected to the base and the holding portion disposed further backward than the fixing portion of the frame component.

* * * * *